(12) United States Patent
Riederer et al.

(10) Patent No.: US 7,346,383 B2
(45) Date of Patent: Mar. 18, 2008

(54) METHOD FOR ACQUIRING MRI DATA FROM VARIABLE FIELDS OF VIEW DURING CONTINUOUS TABLE MOTION

(75) Inventors: Stephen J. Riederer, Rochester, MN (US); Houchun H. Hu, Rochester, MN (US); David G. Kruger, Nelson, WI (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 563 days.

(21) Appl. No.: 11/021,078

(22) Filed: Dec. 22, 2004

(65) Prior Publication Data

US 2006/0020198 A1 Jan. 26, 2006

Related U.S. Application Data

(60) Provisional application No. 60/586,325, filed on Jul. 8, 2004.

(51) Int. Cl.
*A61B 5/05* (2006.01)
(52) U.S. Cl. .................. 600/410; 600/407; 600/413; 600/415; 600/419; 600/424; 600/428
(58) Field of Classification Search ........ 600/405–420; 324/307
See application file for complete search history.

(56) References Cited

U.S. PATENT DOCUMENTS 5,423,315 A * 6/1995 Margosian et al. ......... 600/410
5,636,636 A   6/1997 Kuhn et al.
5,924,987 A   7/1999 Meaney et al.
5,928,148 A * 7/1999 Wang et al. ............... 600/420
6,445,181 B1 * 9/2002 Pelc et al. ................. 324/307

FOREIGN PATENT DOCUMENTS

GB        2 345 139 A      6/2000

OTHER PUBLICATIONS

Hope W. Korin et al., Compensation for Effects of Linear Motion in MR Imaging, Mag. Reson. in Med. Oct. 12, 1989, No. 1, Duluth MN, pp. 99 113.
David G. Kruger et al., Continuously Moving Table Data Acquisition Method For Long FOV Contrast-Enhanced MRA and Whole-body MRI, Mag. Reson. in Med. 47:224-231 (2002).

* cited by examiner

*Primary Examiner*—Brian Casler
*Assistant Examiner*—Sanjay Cattungal
(74) *Attorney, Agent, or Firm*—Quarles & Brady LLP

(57) ABSTRACT

MRA data is acquired from a large region of interest by translating the patient through the bore of the MRI system as a three-dimensional MRA data set are acquired. The pulse sequence is altered during the scan to change the lateral $FOV_L$ of the acquired image to better match the size of the region of interest along its length. Patient table movement is controlled to track a bolus of contrast agent as it passes through the region of interest. A seamless image of the entire region of interest is reconstructed after the acquired data is resampled in regions where the lateral $FOV_L$ is altered.

13 Claims, 9 Drawing Sheets

US 7,346,383 B2

METHOD FOR ACQUIRING MRI DATA FROM VARIABLE FIELDS OF VIEW DURING CONTINUOUS TABLE MOTION

CROSS-REFERENCE TO RELATED APPLICATIONS

This application is based on U.S. Provisional Patent Application Ser. No. 60/586,325 filed on Jul. 8, 2004 and entitled "Application Of Variable FOV To Continuously Moving Table MRI".

STATEMENT REGARDING FEDERALLY SPONSORED RESEARCH

This invention was made with government support under Grant HL70620 and EB00212 awarded by the National Institute of Health. The United States Government has certain rights in this invention.

BACKGROUND OF THE INVENTION

The field of the invention is magnetic resonance angiography ("MRA"), and particularly, studies of the human vasculature using contrast agents which enhance the NMR signals.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals, or "views" are digitized and processed to reconstruct the image using one of many well known reconstruction techniques.

MR angiography (MRA) is the application of magnetic resonance imaging methods to the depiction of the human vasculature. To enhance the diagnostic capability of MRA a contrast agent such as gadolinium can be injected into the patient prior to the MRA scan. Excellent diagnostic images may be acquired using contrast-enhanced MRA if the data acquisition is properly timed with the bolus passage.

The non-invasiveness of MRA makes it a valuable screening tool for cardiovascular diseases. Screening typically requires imaging vessels in a large volume. This is particularly true for diseases in the runoff vessels of the lower extremity. The field of view (FOV) in MR imaging is limited by the volume of the $B_0$ field homogeneity and the receiver coil size (typically, the FOV<48 cm on current commercial MR scanners). The anatomic region of interest in the lower extremity, for example, is about 100 cm and this requires several FOVs, or stations, for a complete study. This requires that the patient be repositioned inside the bore of the magnet, the patient be re-landmarked, scout images be acquired and a preparation scan be performed for each FOV. All of these additional steps take time and, therefore, are expensive. When contrast enhanced MRA is performed, the repositioning also necessitates additional contrast injections.

Recently gadolinium-enhanced bolus chase techniques have been reported which overcome this difficulty, K. Y. Ho, T. Leiner, M. H. de Hann, J. M. A. van Engleshoven, "Gadolinium optimized tracking technique: a new MRA technique for imaging the peripheral vascular tree from aorta to the foot using one bolus of gadolinium (abs)." *Proc. 5th Meeting of ISMRM*, p 203, 1997. As described in U.S. Pat. Nos. 5,924,987 and 5,928,148, MRA data is acquired from a large field of view by automatically moving the patient table to a plurality of different locations during the scan and acquiring an image at each station. The movement of the table may be timed to follow the contrast bolus through the vasculature so that peak contrast is achieved at each station.

The result of prior bolus chase MRA methods is that one ends up with a plurality of images. These are manually or automatically registered with each other to provide a single image that covers the entire extended field of view. One difficulty with this approach, however, is that the separate images have different brightnesses and/or contrasts. As a result, there are discontinuities at the boundaries of images where they have been patched together. Another difficulty with the multi-station method is that valuable time is lost when the table is moved from one station to the next. During that time no image data is being acquired and further time is lost in bringing the spin magnetization into dynamic equilibrium before image data is acquired. In a three-dimensional scan this lost data acquisition time can mean that the scanning process does not keep pace with the moving contrast bolus and some image contrast is lost in later images.

An advantage of the multi-station method is that the lateral field of view of the image acquired at each station can be changed to provide appropriate coverage of the vessels of interest. Referring to FIG. 7, for example, the lateral size of the vascular tree varies significantly as one scans from the abdomen to the feet of a patient. In a multi-station scan the lateral $FOV_y$ at each station can be tailored to the width of the vasculature. Since the image at each station is separately reconstructed and then combined with adjacent reconstructed images, the difference in $FOV_y$ is not a problem.

As described in co-pending U.S. patent application Ser. No. 09/993,120 filed on Nov. 26, 2001 and entitled "Method For Acquiring MRI Data From A Large Field Of view Using Continuous Table Motion", one can also acquire MRI data from an extended field of view in one continuous scan. With this method the patient table is in continuous motion and the phase encodings for the lateral $FOV_y$ and lateral $FOV_z$ if 3D) are repeatedly cycled during the scan. One large image over the extended longitudinal FOV is reconstructed from the acquired MRI data. Because this method is limited to a single $FOV_y$ the lateral $FOV_y$ must be set to the largest size needed during the scan. Scan time and/or image resolution is thus wasted when portions of the vasculature having a smaller lateral extent are scanned.

SUMMARY OF THE INVENTION

The present invention is a method for acquiring an MR image from an extended longitudinal field of view in which the patient table is continuously moved during the scan. The present invention is a method and system for acquiring MRI data from a subject at different lateral fields of view as the subject is continuously moved through an MRI system during a scan. Regions in the resulting acquired k-space data in which the spacing between k-space samples along the lateral dimension are mixed due to changes in lateral FOV are interpolated to provide uniform lateral k-space samples prior to image reconstruction.

A general object of the invention is to change lateral FOV during a continuous table motion scan without producing artifacts in the resulting reconstructed image. This is accomplished by creating uniformly spaced k-space samples by interpolating between acquired k-space samples in regions where k-space data is acquired at two different lateral k-space sampling intervals.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

A moving table acquisition allows the subject to be imaged over a field of view (FOV) which can be many times larger than the static FOV allowed by a typical MRI scanner. In the preferred embodiment the MRI scanner runs uninterrupted while the patient table is continuously moved through the portion of the scanner volume which presents the best combination of homogeneous static magnetic field and linear magnetic field gradients. This region is typically known as the scanner's "sweet spot." In the preferred embodiment the acquisition of arbitrarily large FOVs along the table motion direction is achieved with one uninterrupted data set. Either two or three-dimensional imaging is possible.

Figure 3:
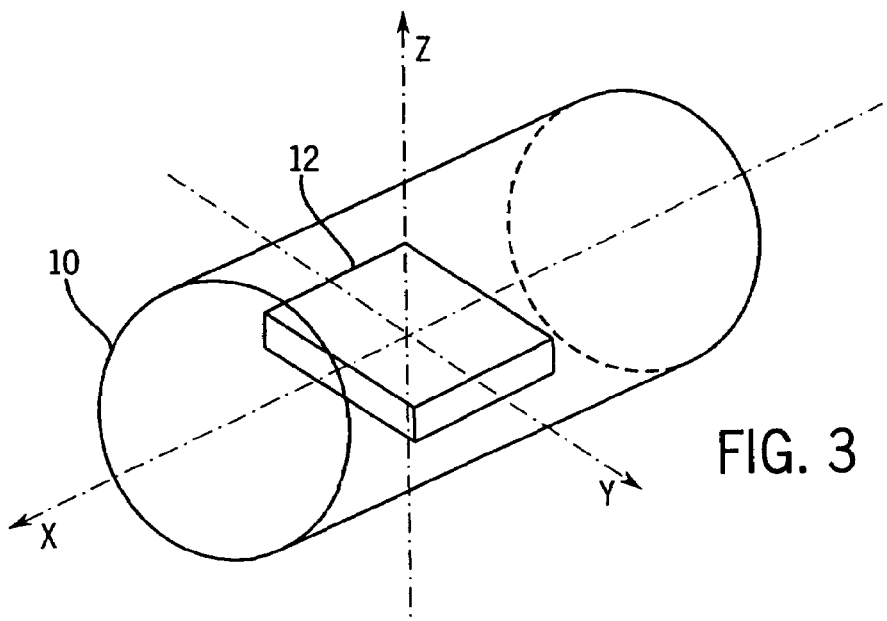
FIG. 3 is a schematic representation of an exemplary imaging volume within the bore of the MRI system of FIG. 1.

Referring to FIG. 3, a slab 12 with coronal orientation is being imaged in the bore 10 of an MRI scanner. The readout direction (X axis) is along the direction of motion of the table and the slab select direction is along the Z axis. For 2DFT imaging, phase encoding is performed along the Y axis and for 3DFT imaging, phase encoding is performed along both the Y and Z axes.

We define $FOV_{tot}$ as the full desired field of view along the "longitudinal" X direction and $FOV_x$ as the field of view along X for the readout of any single NMR signal. We assume that $FOV_{tot} > FOV_x$ thus necessitating the invention described here to provide an image for the full FOV if continuous table motion is desired. We define $FOV_L$ as the field of view along either of the "lateral" Y or Z directions.

As the subject is moved through the scanner along the x-axis, MRI data is acquired from the slab 12 by a series of imaging pulse sequences. During each pulse sequence the readout of the encoded k-space data is performed in the X direction. The raw k-space data is typically anti-alias filtered and subsequently sampled at a bandwidth assuming some $FOV_x$ in the readout (X) direction.

Figure 4:
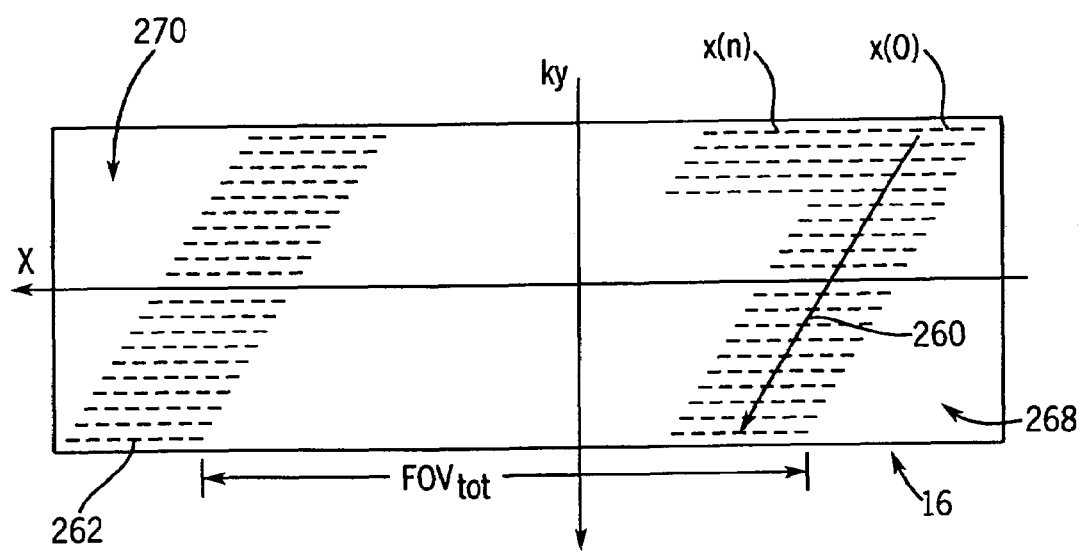
FIG. 4 is a schematic representation of a data matrix into which data acquired with the pulse sequence of FIG. 2 is stored.

Referring to FIG. 4, when the lateral $FOV_L$ is kept constant during the entire scan the raw k-space data are acquired in a series of imaging pulse sequences, a Fourier transformation (FT) is performed on each NMR signal in the readout direction and the result is placed in a matrix of memory locations 16 which represents the desired resolution in the X, Y and Z directions. This once-transformed view is a line of data placed in the matrix 16 and shifted in the X direction to a position that represents the patient position at the time the NMR echo signal was acquired. The position of the patient table relative to a reference location is known for every echo readout. The data acquisition is performed until all of the data matrix 16 is filled and the table has reached the final position. The final image is formed by Fourier transforming along the remaining Y, and if 3D, the Z directions. Such an acquisition and image reconstruction is described in the above-cited co-pending U.S. patent application.

Figure 1:
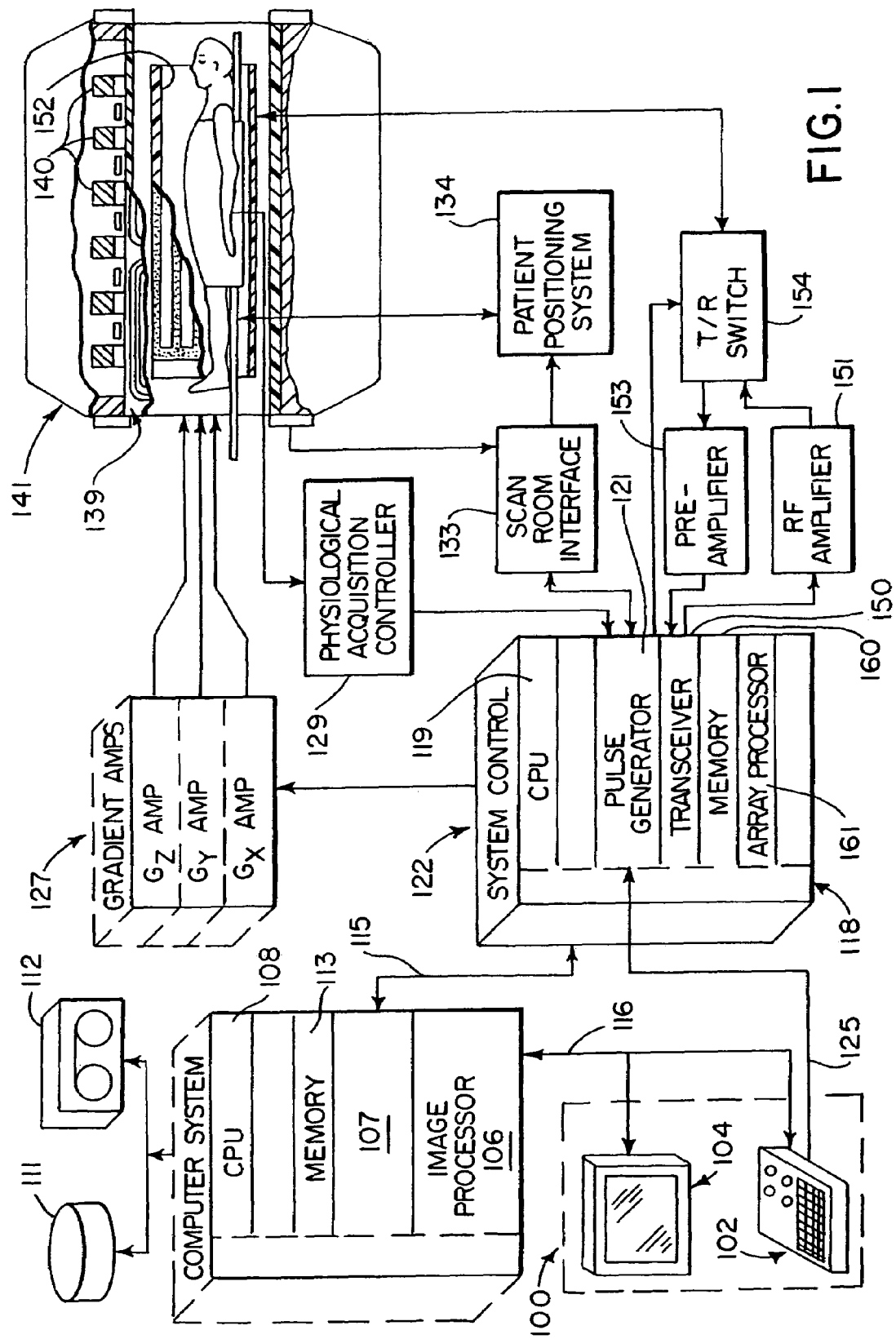
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands from the pulse generator module 121 to move the patient through the scanner to perform the scan in accordance with the present invention. The current position of the table at any time during the scan is read into the system control 122 and is used to adjust the acquired NMR data according to the present invention as will be described in more detail below. The operator can control the operation of the patient positioning system 134 through the keyboard and control panel 102. This includes controlling the velocity of table motion during the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150.

The NMR signals picked up by the RF local coil are digitized by the transceiver module 150 and transferred to a memory module 160 in the system control 122. An array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,922,736 which are incorporated herein by reference.

Figure 2:
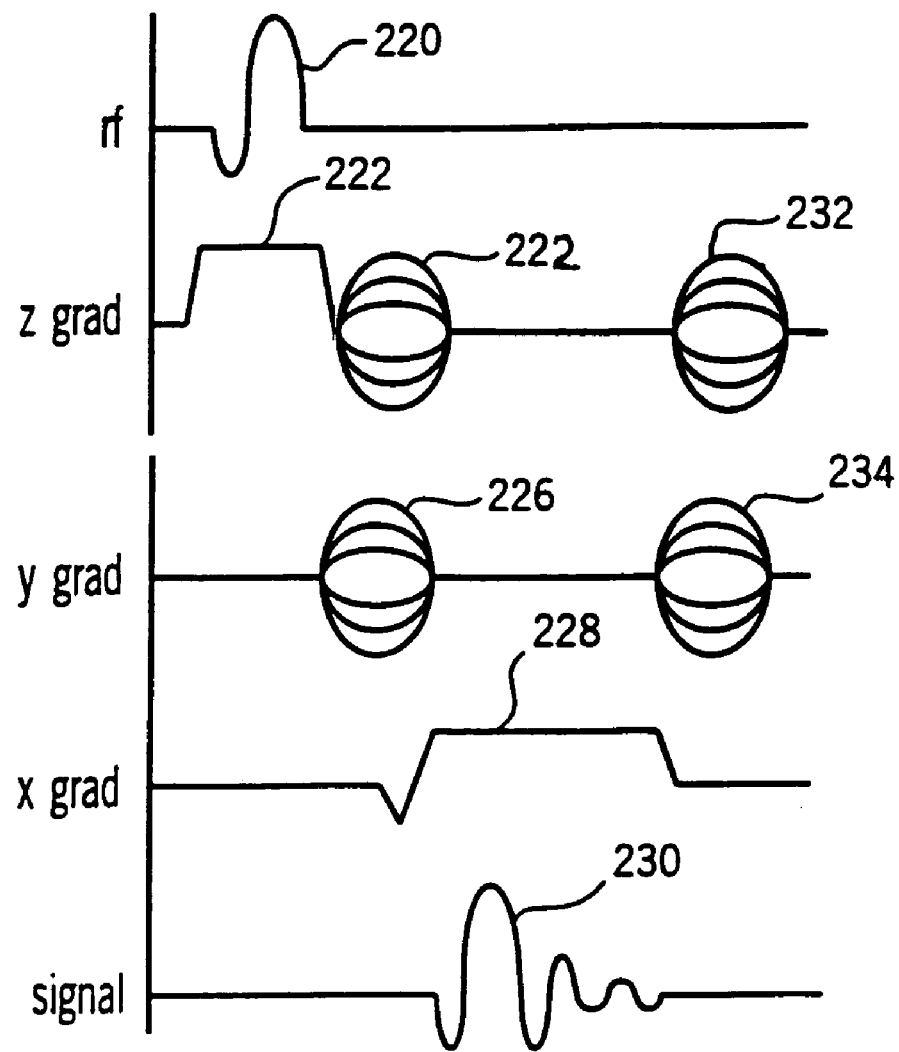
FIG. 2 is a graphic representation of a pulse sequence performed by the MRI system of FIG. 1 to practice a preferred embodiment of the invention.

While many pulse sequences may be used to practice the present invention, in the preferred embodiment a 3D gradient-recalled echo pulse sequence is used to acquire the NMR data. Referring particularly to FIG. 2, an RF excitation pulse 220 having a flip angle of 45 degrees is produced in the presence of a slab select gradient pulse 222 to produce transverse magnetization in the 3D volume of interest as taught in U.S. Pat. No. 4,431,968. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 are applied to rephase the magnetization before the pulse sequence is repeated as taught in U.S. Pat. No. 4,665,365.

As is well known in the art, the pulse sequence is repeated and the phase encoding pulses 224 and 226 are stepped through a series of values to sample the 3D k-space in the field of view. In the preferred embodiment 32 phase encodings are employed along the z axis and the number of phase encodings employed along the y axis will change during the scan depending on the prescribed lateral $FOV_y$ at each longitudinal location. Sampling along the longitudinal $k_x$ axis is performed by sampling the echo signal 230 in the presence of the readout gradient pulse 228 during each pulse sequence. It will be understood by those skilled in the art that only a partial sampling along the $k_x$ axis may be performed, and if this is done, the missing data is computed using a homodyne reconstruction or by zero filling. This enables the echo time (TE) of the pulse sequence to be shortened to 1.0 ms and the pulse repetition rate (TR) to be shortened to 4.5 ms.

Figure 5:
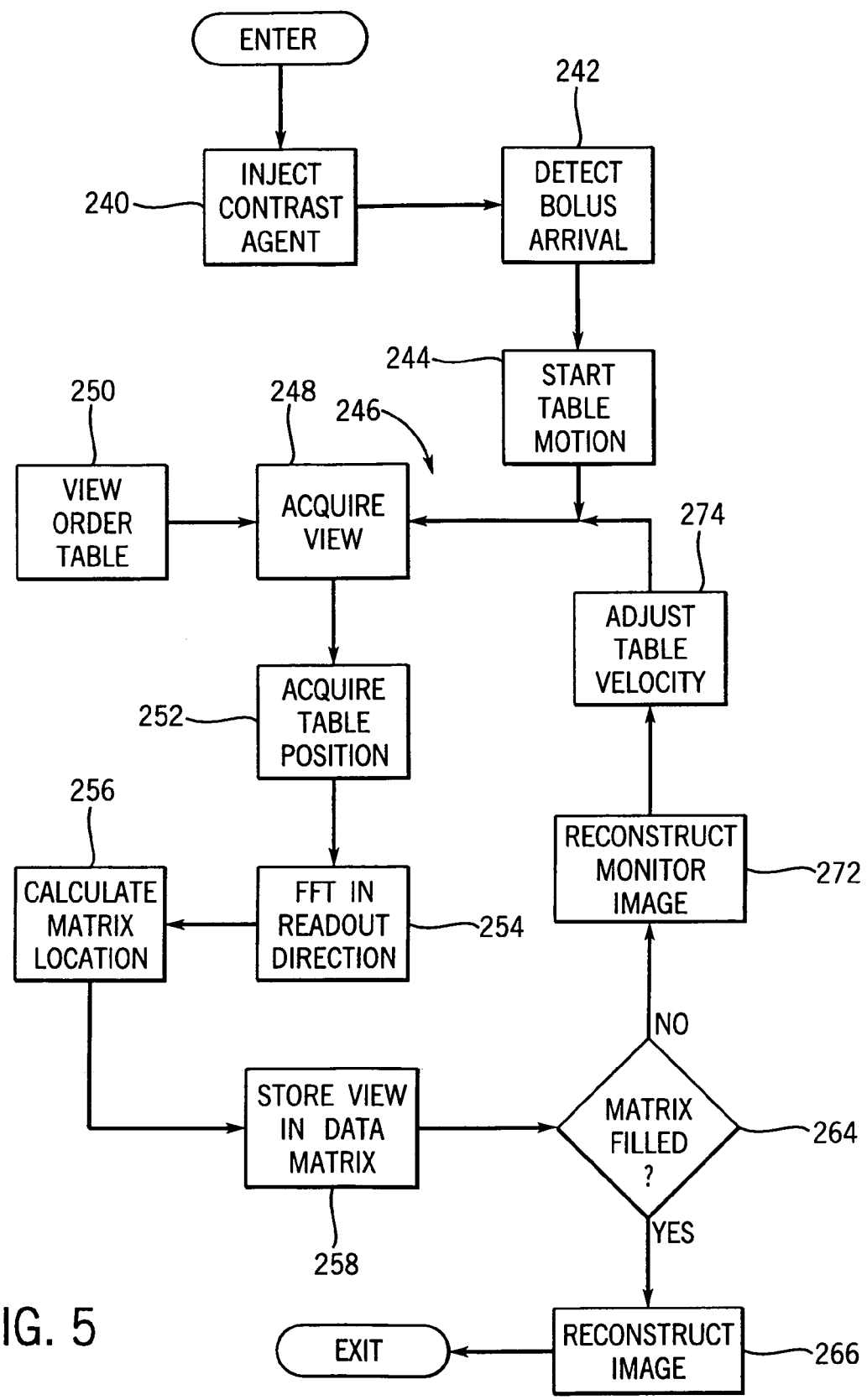
FIG. 5 is a flow chart illustrating the steps employed in practicing the preferred embodiment of the invention

The preferred embodiment of the invention is a 3D CE-MRA scan of a subject after injection of a contrast agent. When the scan prescription is entered by the operator, scan parameters such as the imaging pulse sequence FOV and resolution are defined along all axes. The $FOV_{tot}$ is also defined and based on this information a data matrix 16 is defined as illustrated in FIG. 4. Referring particularly to FIG. 5, after the injection of the contrast agent at process block 240, 2D images are rapidly acquired and reconstructed to display the vasculature at the starting boundary of the $FOV_{tot}$. Arrival of the contrast bolus is detected at process block 242 by observing when the arteries brighten. At this time table movement is initiated as indicated at process block 244. There are other methods for detecting bolus arrival, including automated methods such as that described in U.S. Pat. No. 6,167,293.

A loop is then entered at 246 in which MRI data is acquired as the table moves the patient through the sweet spot of the scanner. A table reference location is also established at this time. As indicated at process block 248, a view is acquired by performing the above-described pulse sequence. Many different view orders may be employed and the prescribed view order is stored in table 250. After acquisition of the NMR echo signal, the current table position is also acquired, as indicated at process block 252, and the NMR echo signal is Fourier transformed along the x-axis as indicated at process block 254. As indicated at process block 256, the proper location in the data matrix 16 for the acquired view is then calculated and the data is stored therein as indicated at process block 258.

Figure 6:
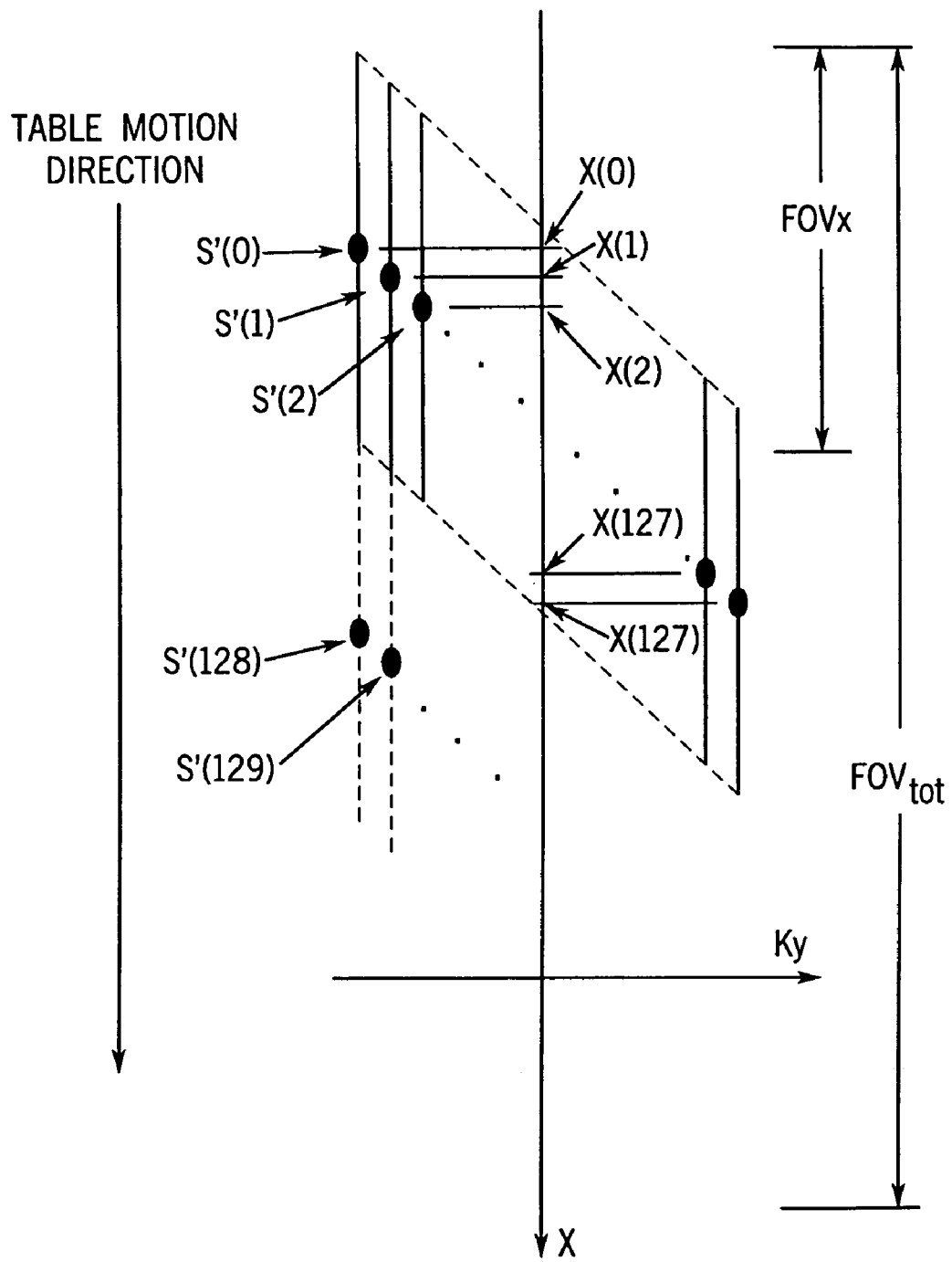
FIG. 6 is a schematic representation showing how acquired data is stored in the data matrix of FIG. 4.
Figure 7:
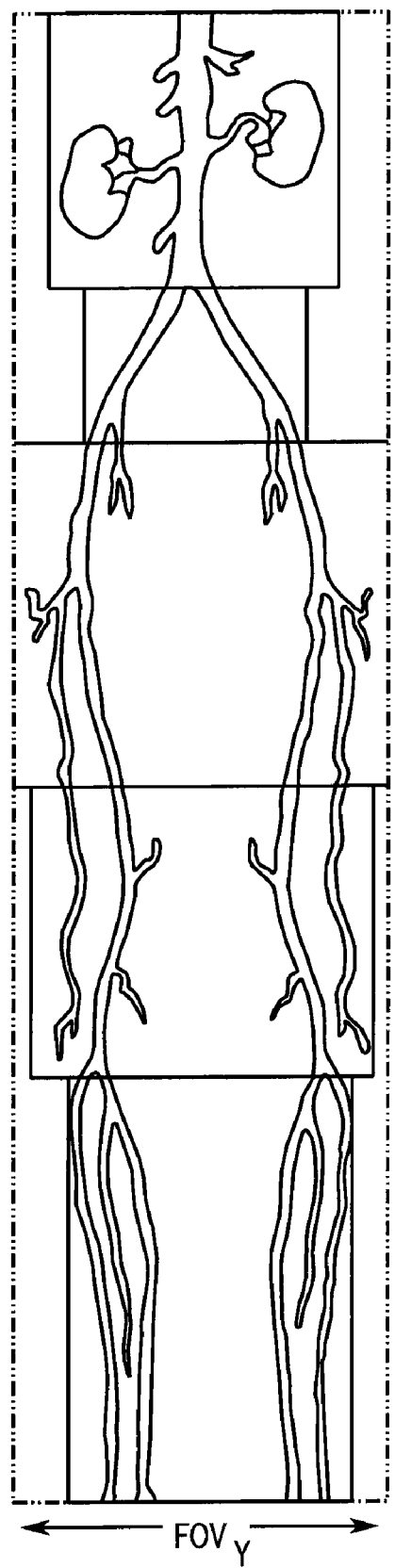
FIG. 7 is a pictorial view of an image acquired with different lateral fields of view.

The location for each acquired view in the data matrix 16 is determined by two factors, the view number and the location of the patient table at the time the view was acquired. This is illustrated in FIGS. 4 and 6 for a two-dimensional acquisition with a monotonic view order. The first view is acquired at echo location x(0) which serves as a reference location. Subsequent views are acquired as the y axis phase encoding is stepped through its values. The location in the data matrix 16 along its lateral $k_y$ axis is determined by the $G_y$ phase encoding for the view. As indicated by arrow 260, the center of each successively acquired NMR echo signal after Fourier transformation along x is also shifted along the x-axis due to table movement. The amount of this shift from the reference position x(0) is measured at the time of view acquisition using an electronic spatial encoder or by using the following equation:

$$x(n)=V_{ref}\cdot t$$

or alternatively $$x(n)=V_{ref}\cdot n\cdot TR$$

where $V_{ref}$ is the table velocity, t is the time past since the beginning of the scan, n is the number of pulse sequence repetitions since the start of the scan and TR is the time required for one pulse sequence repetition. The storage pattern is similar to a usual Cartesian k-space sampling pattern, but it is skewed by the table motion. When all the phase encoding views have been acquired, the process repeats and each new view of once transformed data is concatenated to the previous acquired $k_y$ view. It should be apparent that in a 3D acquisition a series of $k_z$ phase encoded views are also acquired at each $k_y$ phase encoding, and these are shifted and stored in a 3D data matrix 16 in the same manner.

In general, the table motion might be such that the displacement along X from one repetition to the next is not an integral number of X pixels. The data for these repetitions must be shifted with a precision of less than one pixel to maintain consistency. The displacement X(n) is known and can be split into two parts as follows:

$$X(n)=m\cdot \Delta x+\delta x(n) \quad (5)$$

where $\Delta x$ is the pixel to pixel spacing along the x-direction:

$$\Delta x = \frac{FOV_x}{N_x} = \frac{FOV_{tot}}{N_{tot}} \quad (6)$$

where $N_x$ and $N_{tot}$ are the number of pixels in the X direction for the echo readout and for the total FOV respectively. Also, m is the largest integer such that $m\cdot \Delta x<X(n)$, and $\delta(n)$ is the sub-pixel-sized remainder which forces equation (5) to hold. As before, n is the index on the pulse sequence repetition number. The actual displacement positioning consists of two steps, coarse and fine, presented here in reverse order of application for ease of understanding.

Step 2, coarse positioning: The Fourier transformed signal is shifted by m pixels as given in the first term of equation (5) and directly placed into the hybrid matrix 16 with a positional accuracy of $\Delta x$. The data then requires additional sub-pixel correction by the amount $\delta(n)$ to maintain data consistency. This process is performed in step 1.

Step 1, fine positioning: Prior to Fourier-transformation in X, a phase twist representing the sub-pixel correction $\delta(n)$ is applied along the sampled echo; i.e.

$$\hat{S}_n(k_x,k_y(n)) = e^{i2\pi \frac{k_x}{N_x}\cdot \frac{\delta(n)}{\Delta x}}\cdot S_n(k_x,k_y(n)). \quad (7)$$

Fourier transformation of $\hat{S}_n$ along the x-axis followed by the coarse positioning of Step 2 yields the desired $S'_n(x,k_y,(n))$. In principle it would be possible to perform the entire displacement positioning using the phase manipulation approach of equation (7), but because multiple Fourier transformations of length $N_{tot}$ would be required for each $k_y$ value acquired, this "direct method" is not preferred because the two part position shifting and phase shifting has been found to be computationally more efficient.

It can be seen that after one complete cycle of $k_y$ phase encoding values has been completed and stored in the data matrix 16, the process repeats itself and the phase encodings are applied a second time. Depending upon the number of phase encodings and the patient table velocity, the second time a view is acquired for a specific lateral phase encoding, the placement of the echo signal samples in the data matrix 16 along the x direction may or may not overlap with some of the echo signal samples acquired for the previous measurement at that phase encoding. In the 2D example shown in FIG. 4, such a view is shown at x(n) and the timing is such that there are no overlapping samples with the previously acquired view at x(0). If some overlap occurs then the redundant, overlapping signal samples can be averaged to improve SNR or the most recent sample can be retained. Other options are also possible.

Referring again to FIG. 4, views are acquired and stored in the data matrix 16 until samples have been acquired for the entire extended field of view $FOV_{tot}$. The last view is indicated at 262 in FIG. 4, and after it is acquired and stored as determined at decision block 264, the scan is complete and a single image is reconstructed at process block 266 using the samples in data matrix 16. In the 3D acquisition of the preferred embodiment, this reconstruction includes Fourier transformation of the data matrix 16 along the $k_y$ and $k_z$ axes and calculation of pixel intensities from the resulting complex numbers. Typically, a two-dimensional projection image is then produced from the resulting three-dimensional array of image pixel intensities. The well-known maximum intensity pixel ("MIP") technique is preferred for producing the projection image and a pre-contrast mask image may also be subtracted to suppress signals from non-vascular tissues.

As shown in FIG. 4, the extended field of view $FOV_{tot}$ over which complete k-space sampling is acquired is smaller than the x axis extent over which samples are acquired. The regions 268 and 270 of partial sampling at the beginning and end of the scan can also be reconstructed to extend the total field of view, but it can be appreciated that image quality will decline as fewer samples are used in the reconstruction.

Referring again to FIG. 5, after each view is acquired and stored during the scan, data in the data matrix 16 may be employed to reconstruct a two-dimensional monitor image as indicated at process block 272. Real-time images are thus produced for the operator who can use the information therein to control the scanning process. In addition to changing the usual scan parameters, the operator can adjust the table velocity as indicated at process block 274. This might be done, for example, to better match the speed at which the contrast bolus is moving through the extended field of view $FOV_{tot}$.

The real-time 2D monitor image may be produced in a number of ways. The preferred method is to reconstruct a full maximum intensity pixel (MIP) projection through the image stack as the data is being acquired. Unlike typical static 3D image acquisitions, a partial 3D data set can be reconstructed as the hybrid matrix fills. For Nz slices and Ny phase encodes in Y, Ny Fourier transforms in the Z direction and Nz Fourier transforms in the Y direction can be performed with each TR. Each set of these described Fourier transform sets in Z and Y (including the previous transform in X) provide a partial 3D image set that is of one pixel length in the X direction. Ny pixels in the Y direction and Nz pixels in the Z direction. The maximum pixel value of a projection through this partial image set as well as earlier partial data sets can be found at the same time. The projection may be in the Z direction directly or in oblique angles through previously reconstructed partial image sets. The 2D MIP images can be displayed on the real-time monitor as each portion of the 3D data set is filled. Also, specific individual slices from the 3D data set can be viewed in real time rather than the MIP projection.

The longitudinal $FOV_x$ can be varied during the scan. An acquisition can be performed with higher table velocity and thus greater temporal efficiency if a portion, or all of the hybrid space is acquired with a larger $FOV_x$. $FOV_x$ can also be reduced if a higher spatial resolution is desired for a limited region within the $FOV_{tot}$. Regardless of changes in table speed or readout $FOV_x$, a single, data matrix 16 is formed from which a seamless image of the extended field of view $FOV_{tot}$ can be reconstructed.

The present invention also enables one to vary the lateral $FOV_L$ during the performance of continuous table motion scan. In this case the scan prescription will have a series of lateral $FOV_L$ scan parameters along with the longitudinal x-axis location at which each is to take effect during the scan. As a result, the pulse sequence of FIG. 2 is altered during the scan as the table location reaches each x-axis location at which a different lateral $FOV_L$ is to be acquired. Each alteration changes the size of the steps in phase encodings needed to acquire the prescribed resolution over the prescribed lateral $FOV_L$. In the following discussion the lateral $FOV_L$ is in the $k_y$ phase encoding direction, but it can be appreciated that the $k_z$ phase encoding direction can also be used.

Figure 8:
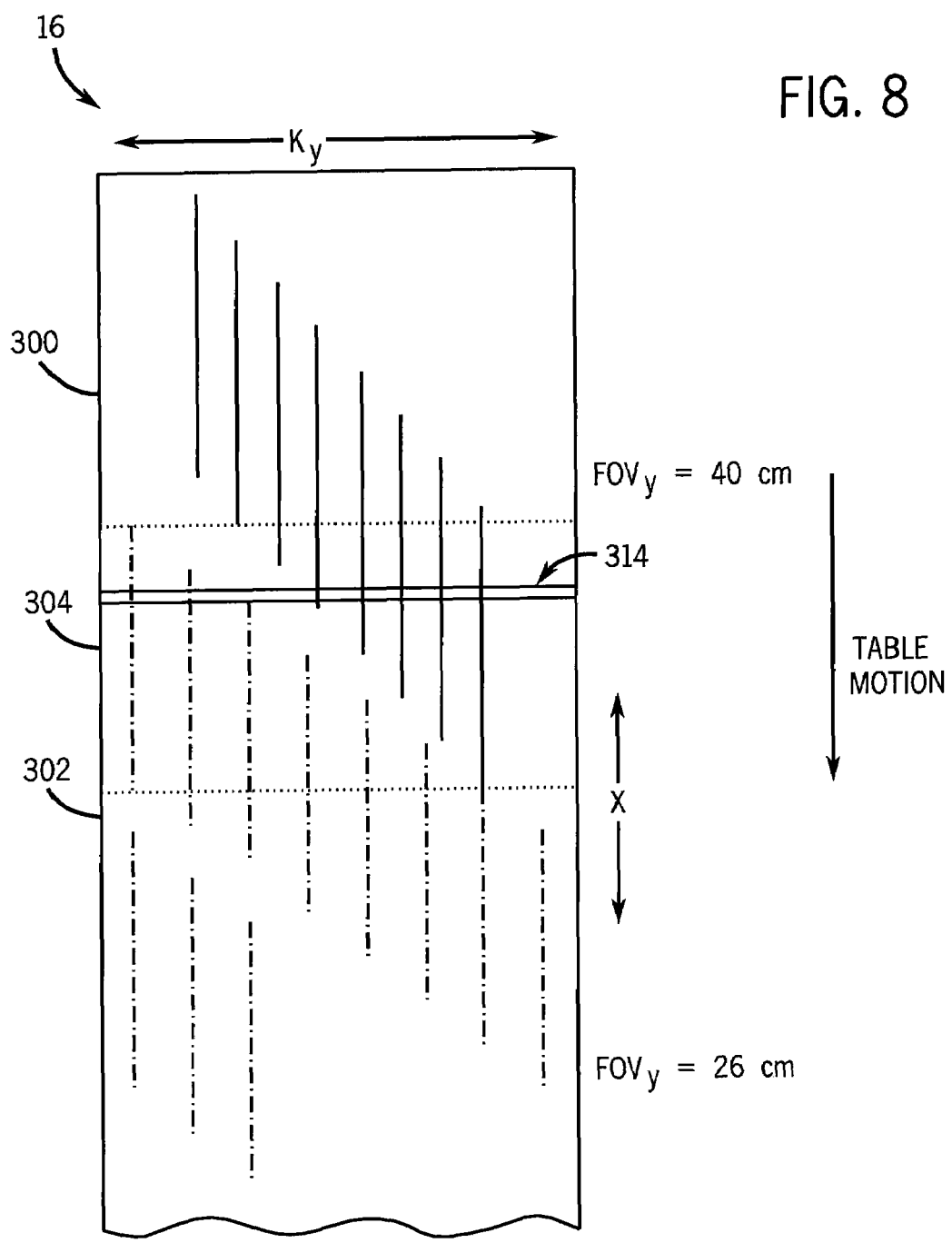
FIG. 8 is a schematic representation of the data matrix of FIG. 4 into which data acquired at two different lateral fields of view is stored.

Referring particularly to FIG. 8, as a result of the change in lateral $FOV_y$ during the scan the k-space sampling in the lateral, $k_y$ phase encoding direction is no longer uniform throughout the longitudinal $FOV_x$. The lateral k-space sampling interval and the lateral field of view ($FOV_y/FOV_z$) are related by: $\Delta k_y=1/FOV_y$; and $\Delta k_z=1/FOV_z$. In a first region 300 where a larger $FOV_y=40$ cm is prescribed, for example, the k-space samples along the lateral $k_y$-axis are more closely spaced then the k-space samples in a second region 302 where a smaller $FOV_y=26$ cm is prescribed. In addition, a transition region 304 results in which the k-space samples stored in the data matrix 16 is mixed. Some of the samples in region 304 align with k-space samples in region 300 and some of them align with samples in region 302. Conversely, these samples are misaligned with each other and some are misaligned with region 300 and the others misaligned with region 302. As a result, if an image is reconstructed as described above by performing a Fourier transformation of the entire data matrix 16 along the $k_y$ axis, significant image artifacts will be produced.

Figure 9:
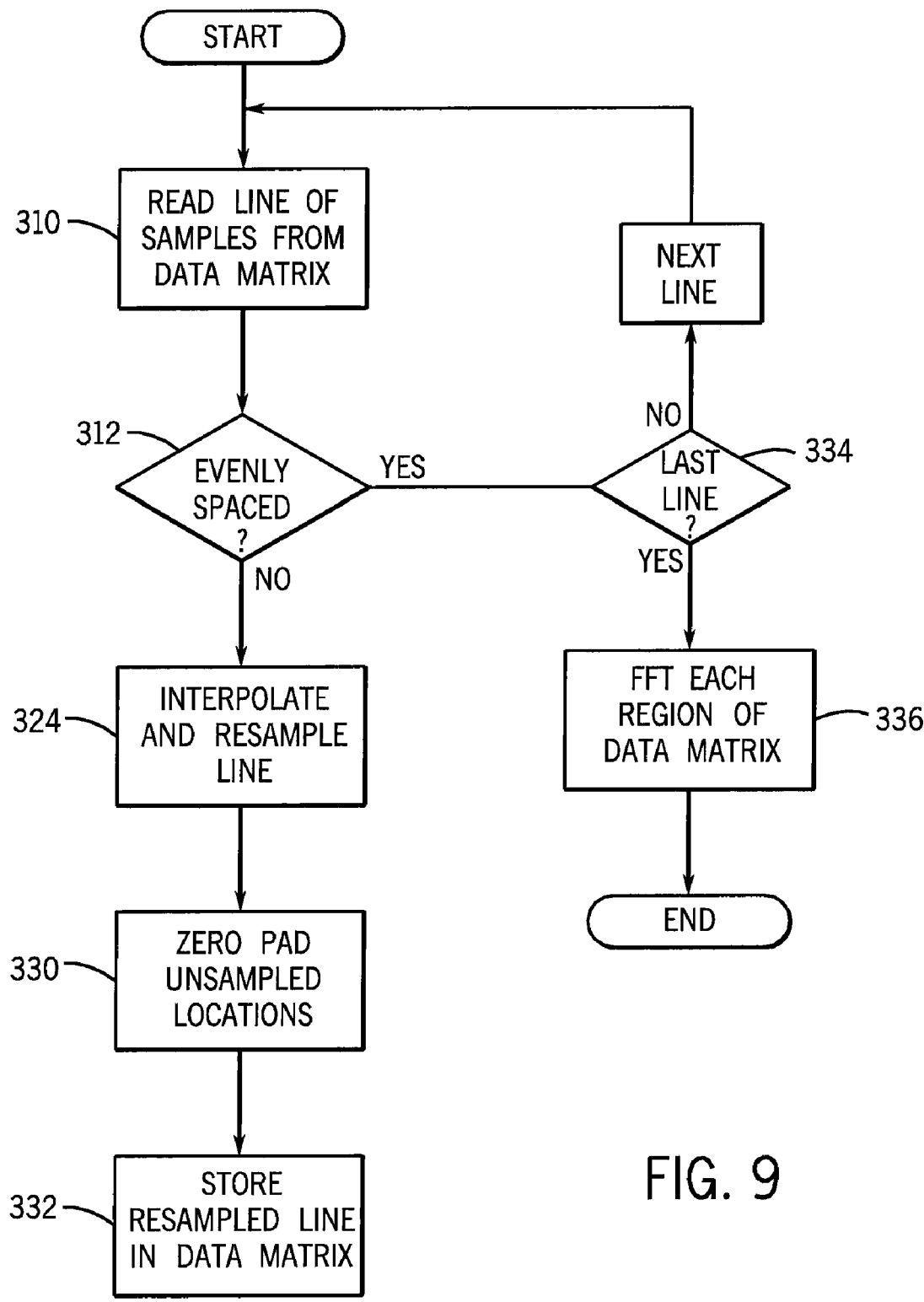
FIG. 9 is a flow chart of the steps used to reconstruct an image according to a preferred embodiment of the invention.
Figure 10:
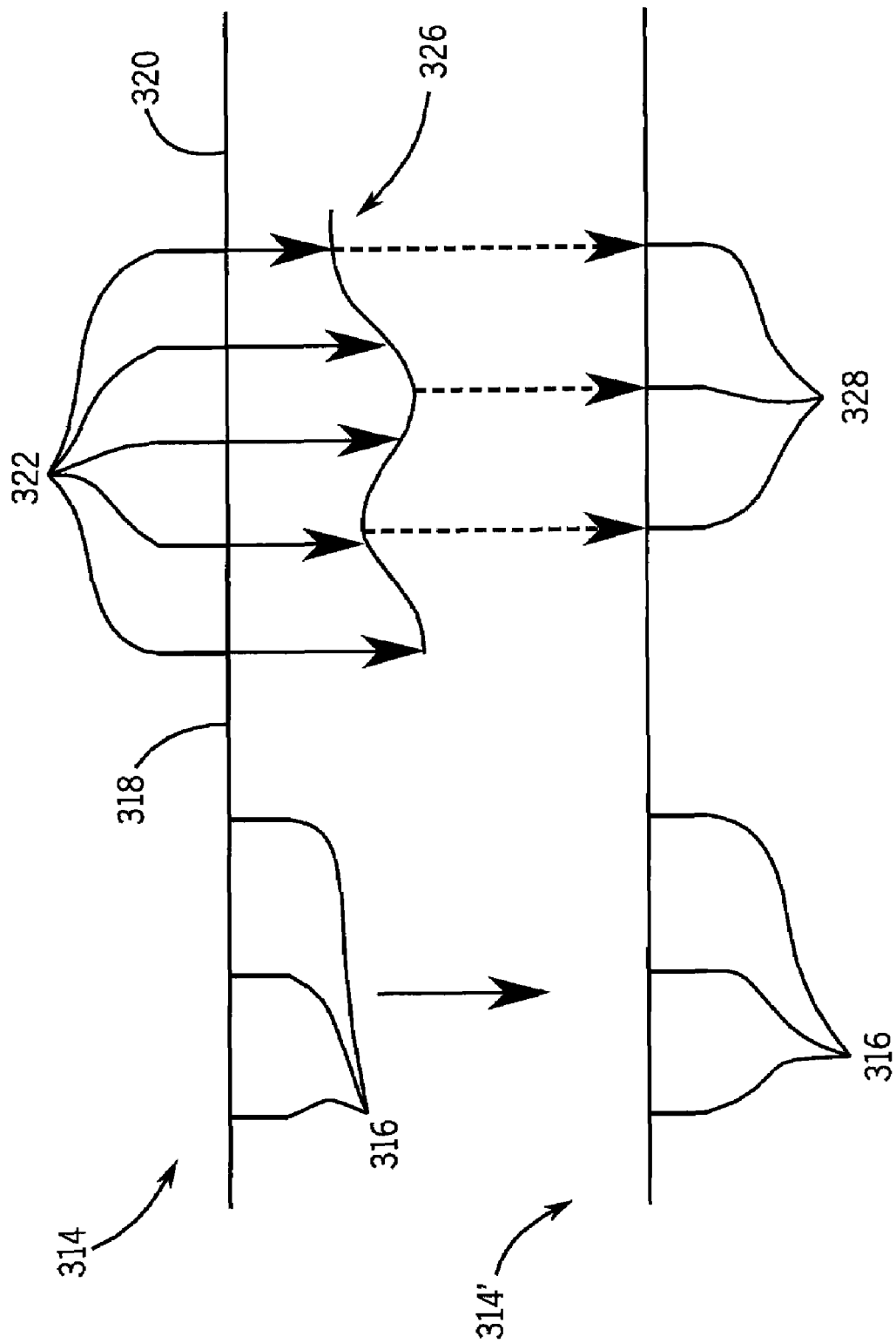
FIG. 10 is a graphic illustration of steps performed in FIG. 9.

It is a teaching of the present invention that these image artifacts can be substantially eliminated by altering the image reconstruction method carried out in process block 266. This improved reconstruction method is shown in FIG. 9. As indicated at process block 310 a line of k-space samples is read from the data matrix 16 and examined. In region 300 each line contains samples that are evenly spaced along the $k_y$ axis at intervals $\Delta k_{y1}$ as determined at decision block 312. However, when lines in the transition region 304 are examined, the samples are not evenly spaced. For example, if a line indicated at 314 in FIG. 8 is examined the samples will not be uniformly spaced as indicated in FIG. 10. Instead, the line 314 will include samples 316 spaced at intervals $\Delta k_{y2}$, will include two gaps 318 and 320, and will include a set of samples 322 spaced at intervals $\Delta k_{y1}$.

As indicated at process block 324, the next step is to interpolate between the set of samples 322 to produce a spline curve 326 as shown in FIG. 10 that smoothly passes through their values. This spline curve 326 is then sampled at intervals $\Delta k_{y2}$ to produce a set of new samples 328. The samples 316 acquired at intervals $\Delta k_{y2}$ are retained and the regions 318 and 320 where no data is available are zero padded as indicated at process block 330. The resulting line of samples 314' is stored in the data matrix 16, as indicated at process block 332. Because interpolation is done in hybrid space (i.e., x, $k_y$, $k_z$) only along the lateral directions ($k_y$ or $k_z$), resolution along the x axis is not altered.

Each line of acquired data in the data matrix 16 is examined and modified in this manner. When the last line is examined, as determined at decision block 334, a fast Fourier Transform is performed along the $k_y$ axis for each region as indicated at process block 336. The resulting reconstructed image can then be further processed as described above to produce a maximum intensity pixel (MIP) image or the like. To present the final reconstruction of all regions in one image it is desirable to use the same pixel size and FOV throughout. This is achieved by zero padding the hybrid k-space data in region 300 prior to the Fourier transformation, such that the pixel sizes in all the regions 300, 302 and 304 are the same, and by zero padding the periphery of the images reconstructed in regions 302 and 304 to match the lateral $FOV_y$ of region 300. Gradient non-linearity correction is also performed at this time.

It should be apparent that the present invention is applicable to changes in $FOV_L$ in either the phase encoding direction (y-axis) as described above or in the slab select direction (z-axis). It can also be applied to $FOV_L$ variations in both the phase encode and slab select directions during the same scan and to either 2D or 3D acquisitions.

The invention claimed is:

1. In a magnetic resonance imaging (MRI) system having a defined longitudinal field of view (FOV), a method for producing an image of a subject over an extended longitudinal field of view ($FOV_{tot}$) which is larger than the longitudinal FOV, the steps comprising:
   a) moving the subject through the MRI system such that the extended longitudinal field of view ($FOV_{tot}$) passes through the defined longitudinal field of view (FOV);
   b) continuously acquire NMR data from the subject as the subject is moved through the longitudinal FOV by repeatedly performing an imaging pulse sequence which acquires NMR data comprising a view of the subject;
   c) altering the imaging pulse sequence to change the lateral field of view ($FOV_L$) during the performance of step b);
   d) storing each view in a data matrix;
   e) producing resampled data in lines of the data matrix to provide uniform sampling in the lateral direction in the region where the lateral $FOV_L$ is changed; and
   f) reconstructing an image using the resampled data matrix.

2. The method as recited in claim 1 in which the MRI system has a table, and step a) is performed by:
   i) placing the subject on the table; and
   ii) moving the table.

3. The method as recited in claim 2 in which the table is moved continuously while performing step a).

4. The method as recited in claim 2 in which the table is moved at different velocities while performing step a).

5. The method as recited in claim 2 which includes:
   injecting the subject with a contrast agent; and
   in which the table is moved at a velocity which tracks the contrast agent as it moves through the extended longitudinal field of view ($FOV_{tot}$).

6. The method as recited in claim 2 in which step d) includes adjusting the location in the data matrix in which the view is stored as a function of the table location at the time the view is acquired in step b).

7. The method as recited in claim 1 in which step e) includes:
   i) interpolating data in a line of the data matrix;
   ii) resampling the interpolated data to produce a line of data that samples at uniform intervals in the lateral direction; and
   iii) replacing the data in said line of the data matrix with the resampled line of data.

8. The method as recited in claim 7 in which steps i), ii) and iii) are repeated for each line in the data matrix in which sampling in the lateral direction is not uniform.

9. The method as recited in claim 1 which includes:
   g) detecting locations in the data matrix for which no data was acquired; and
   h) setting the locations detected in step g) to zero.

10. In a magnetic resonance imaging (MRI) system, the improvement comprising:
    a) a table for supporting a subject and for moving the subject through a defined longitudinal field of view (FOV) of the MRI system;
    b) a pulse generator for operating the MRI system under the direction of a pulse sequence to continuously acquire a series of NMR data views of the subject as the subject is moved through the longitudinal FOV, wherein the pulse sequence is altered as the subject is moved through the longitudinal FOV to change the lateral $FOV_L$ of the acquired data;
    c) a memory for storing the acquired views as a data matrix;
    d) means for resampling data in lines of the data matrix to provide uniform sampling in the lateral direction in a region where the lateral $FOV_L$ is changed; and
    e) means for reconstructing an image from data in the data matrix.

11. The improvement as recited in claim 10 in which element c) includes:
    i) means for Fourier transforming each acquired view; and
    ii) means for storing the Fourier transformed view in the data matrix at a location determined by the subject location at the time the view was acquired.

12. The improvement as recited in claim 11 which also includes:
    f) means for controlling the velocity of table motion as views are being acquired.

13. The improvement as recited in claim 11 in which element d) includes:
    iii) means for interpolating between acquired data in a line of the data matrix; and
    iv) means for selecting interpolated data at the uniform sampling interval.

* * * * *